United States Patent [19]

Tan et al.

[11] Patent Number: 5,449,642

[45] Date of Patent: Sep. 12, 1995

[54] METHOD OF FORMING METAL-DISILICIDE LAYERS AND CONTACTS

[75] Inventors: Teh Y. Tan; Gary E. McGuire, both of Chapel Hill; William T. Lynch, Apex, all of N.C.

[73] Assignees: Duke University, Durham; MCNC, Triangle Park, both of N.C.

[21] Appl. No.: 227,659

[22] Filed: Apr. 14, 1994

[51] Int. Cl.$^6$ ................... H01L 21/44; H01L 21/48
[52] U.S. Cl. ..................................... 437/200; 437/41
[58] Field of Search ................. 437/200, 41, 245, 246

[56] References Cited

U.S. PATENT DOCUMENTS

| | | |
|---|---|---|
| 4,378,628 | 4/1983 | Levinstein et al. |
| 4,901,121 | 2/1990 | Gibson et al. |
| 4,908,331 | 3/1990 | Raaijmakers. |
| 5,010,037 | 4/1991 | Lin et al. |
| 5,047,111 | 9/1991 | Ishizaka et al. |
| 5,047,367 | 9/1991 | Wei et al. |

FOREIGN PATENT DOCUMENTS

| | | |
|---|---|---|
| 1-53563 | 3/1989 | Japan. |
| 2-54536 | 2/1990 | Japan. |
| 3-9530 | 1/1991 | Japan. |

OTHER PUBLICATIONS

S. P. Murarka et al "Thin Film Interaction Between Titanium and Polycrystalline Silicon" J. Appl. Phys. 51(1) (Jan. 1960) pp. 342–349.

Fann-Mei Yang, et al. "Phase Transformations in Thin Films" Phase Transformation of Mo and W over Co pp. 329–334 (1993) Mater. Res. Soc. Pittsburg.

J. O. Olowolafe, et al. "Interactions of Cu with Co-Si$_2$,CrSi$_2$, and TiSi$_2$" J. Appl. Phys. 68(12) 15 Dec. 1990, pp. 6207–6212.

Hong Feng et al "Solid State Interaction of Nano–Scale Silicide Formation for Co/Ti Multilayers on Silicon," Mater. Res. Soc. Symp. Proc. vol. 260 (1 May 1992) pp. 187–192 (Abstract).

Feng Hong et al., Nanoscale CoSi$_2$ Contact Layer Growth from Deposited Co/Ti Multilayers on Si Substrates, Appl. Phys. Lett., vol. 61, No. 13, Sep. 28, 1992, pp. 1519–1521.

S. P. Murarka, et al., Cosputtered cobalt silicides on silicon, polycrystalline silicon, and silicon dioxide, J. Appl. Phys., vol. 56, No. 12, Dec. 1984, pp. 3404–3412.

Cecile d'Anterroches, et al., Transmission electron microscopy study of the formation of epitaxial CoSi$_2$/Si(111) by a room–temperature codeposition technique, Appl. Phys. Lett., vol. 52, No. 6, Feb. 1988, pp. 434–436.

K. Rajan, et al., Microstructural stability of epitaxial CoSi$_2$/Si(001) interfaces, J. Appl. Phys., vol. 70, No. 9, Nov. 1991, pp. 4853–4856.

T. L. Lin, et al., Room–temperature codeposition growth technique for pinhole reduction in epitaxial CoSi$_2$ on Si(111), Appl. Phys. Lett., vol. 52, No. 10, Mar. 1988, pp. 804–806.

(List continued on next page.)

Primary Examiner—Olik Chaudhuri
Assistant Examiner—C. Everhart
Attorney, Agent, or Firm—Bell, Seltzer, Park & Gibson

[57] ABSTRACT

A method of forming a metal-disilicide (MSi$_2$) film from a silicon-on-insulator (SOI) substrate having an insulating underlayer and a silicon outerlayer includes the formation of a first capping layer on a portion of the silicon outerlayer. The first capping layer preferably includes titanium and a preselected metal (M) such as cobalt. A step is then performed to convert a first portion of the silicon outerlayer to metal-disilicide. This step is preferably accomplished by a rapid thermal annealing step. Thereafter, a second capping layer is formed on the metal-disilicide layer. The second capping layer preferably includes titanium and metal-monosilicide (MSi). Next, a step is performed to convert a second portion of the silicon outerlayer, beneath the first portion, to metal-disilicide while preventing phase-reversal of the already formed metal-disilicide layer to metal-monosilicide. This step is preferably accomplished by a rapid thermal annealing step as well. The method can preferably be used to form low resistance metal-disilicide contacts to active regions of SOI electronic devices.

24 Claims, 3 Drawing Sheets

OTHER PUBLICATIONS

J. C. Bean, et al., *Silicon/metal silicide heterostructures grown by molecular beam epitaxy,* Appl. Phys. Lett., vol. 37, No. 7, Oct. 1980, pp. 643–646.

R. T. Tung, et al., *Growth of single-crystal CoSi$_2$ on Si(111),* Appl. Phys. Lett., vol. 40, No. 8, Apr. 1982, pp. 684–686.

J. P. Colinge, et al., *CMOS Circuits Made in Thin Simox Films,* Electronics Letters, vol. 23, No. 21, Oct. 1987, pp. 1162–1164.

J. P. Colinge, *Subthreshold Slope of Thin-Film SOI MOSFETs,* IEEE Electron Device Letters, vol. EDL-7, No. 4, Apr. 1986, pp. 244–246.

James C. Sturm, et al., *Increased Drain Saturation Current in Ultra-Thin Silicon-on-Insulator (SOI) MOS Transistors,* IEEE Electron Device Letters, vol. 9, No. 9, Sep. 1988, pp. 460–463.

Yasuo Yamaguchi, et al., *Self-Aligned Silicide Technology for Ultra-Thin SIMOX MOSFETs,* IEEE Transactions on Electron Devices, vol. 39, No. 5, May 1992, pp. 1179–1183.

S. L. Hsia, et al., *Formation of epitaxial CoSi$_2$ films on (001) silicon using Ti-Co alloy and bimetal source materials,* J. Appl. Phys., vol. 70, No. 12, Dec. 1991, pp. 7579–7587.

P. H. Woerlee, et al., *A Half-Micron CMOS Technology Using Ultra-Thin Silicon on Insulator,* International Electron Devices Meeting (1990), No. 25.1.1–25.1.4, pp. 583–586.

Neal Kistler, et al., *Sub-Quarter-Micrometer CMOS on Ultrathin (400 Å) SOI,* IEEE Electron Device Letters, vol. 13, No. 5, May 1992, pp. 235–237.

M. Lawrence, et al., *Growth of epitaxial CoSi$_2$ on (100)Si,* Appl. Phys. Lett., vol. 58, No. 12, Mar. 1991, pp. 1308–1310.

S. L. Hsia, et al., *Resistance and structural stabilities of epitaxial CoSi$_2$ films on (001) Si substrates,* J. Appl. Phys., vol. 72, No. 5, Sep. 1992, pp. 1864–1873.

Lisa T. Su, et al., *Optimization of Series Resistance in Sub-0.2 μm SOI MOSFETs,* International Electron Devices Meeting (1993), No. 30.1.1–30.1.4, pp. 723–726.

Donald A. McQuarrie, et al., *General Chemistry,* W. H. Freeman and Company, publ., 1984, pp. 870–874.

S. L. Hsia, et al., *CoSi and CoSi$_2$ Phase Formation on Bulk and SOI Si Substrates,* Materials Research Society Fall Meeting, Boston, Mass., Dec. 2, 1993.

S. L. Hsia, et al., *Arsenic Diffusion and Segregation Behavior at the Interface of Epitaxial CoSi$_2$ Film and Si Substrate,* Materials Research Society Fall Meeting, Boston, Mass., Nov. 30, 1993.

METHOD OF FORMING METAL-DISILICIDE LAYERS AND CONTACTS

FIELD OF THE INVENTION

The present invention relates to methods of forming microelectronic devices, and more particularly to methods of forming metal-disilicide films on semiconductor substrates.

BACKGROUND OF THE INVENTION

Electronic devices may be formed on thin-film silicon-on-insulator (SOI) substrates with reduced short-channel effects, reduced parasitic and nodal capacitances, increased radiation hardness and reduced process complexity compared to bulk semiconductor devices. However, SOI devices may have parasitic contact resistances, such as high source and drain contact resistances to SOI MOSFETs. These difficulties in using thin-films are disclosed in an article by L. Su., M. Sherony, H. Hu, J. Chung and D. Antoniadis, entitled "*Optimization of Series Resistance in Sub-0.2 $\mu m$ SOI MOSFETs*", International Electron Devices Meeting (1993), No. 30.1.1–30.1.4, pp. 723–726. Accordingly, there is a need for improved interconnects which have low resistance characteristics and which are compatible with thin-film processing techniques.

To address this need, methods for forming epitaxial metal silicides have been developed because of their relatively low electrical resistance, low contact resistivity and high thermal stability. In particular, cobalt-disilicide has been considered attractive as an epitaxial layer on silicon because of its thermal stability and close lattice match with silicon (1.07% smaller than silicon at room temperature). These benefits and a method of forming $CoSi_2$ on silicon are disclosed in an article by M. Lawrence, A. Dass, D. Fraser and C. Wei, entitled *Growth of epitaxial $CoSi_2$ on* (100) *Si*, Appl. Phys. Lett. 58 (12), pp. 1308–1310 (1991). Coinventors T. Tan and G. McGuire also disclose the formation of epitaxial $CoSi_2$ on bulk silicon substrates in an article entitled *Formation of epitaxial $CoSi_2$ films on* (001) *silicon using Ti-Co alloy and bimetal source materials*, J. Appl. Phys. 70 (12), pp. 7579–7587 (1991), the disclosure of which is hereby incorporated herein by reference.

Unfortunately, these methods for forming epitaxial metal-disilicide films may have shortcomings. For example, in the aforementioned article by L. Su, et al., the series resistance of cobalt-disilicide films was found to increase dramatically once the silicide fully consumed the underlying silicon layer. The disclosed reason for the increase in resistance was the conversion of $CoSi_2$ to metal-rich CoSi and the reduction in contact area once the silicon layer was fully consumed. These authors disclose that to achieve low parasitic series resistance, very thin silicides are required which do not fully consume the silicon underlayer of a SOI substrate.

Thus, notwithstanding these attempts to form silicides on bulk silicon and SOI substrates, there continues to be a need for a method of forming low-resistance metal-disilicide films on SOI substrates which does not cause the formation of metal-rich silicides and which achieves low parasitic series resistance.

SUMMARY OF THE INVENTION

It is therefore an object of the present invention to provide a method of forming a metal-disilicide layer ($MSi_2$) on a silicon-on-insulator (SOI) substrate.

It is a further object of the present invention to provide a method of forming a monocrystalline metal-disilicide layer on a SOI substrate.

It is still a further object of the present invention to provide a method of forming an electronic device having low resistance metal-disilicide contacts.

These and other objects, features and advantages are provided by a method of selectively forming a metal-disilicide ($MSi_2$) layer containing silicon and a preselected metal on a SOI substrate, by forming a first metal-disilicide layer and then preventing phase reversal of the metal-disilicide layer to metal-monosilicide (MSi) during subsequent processing steps. The preselected metal can be any one of a number of metals, such as cobalt or other metals wherein the Gibbs free energy reduction in forming the respective metal-monosilicide at a processing temperature is greater than 0.5 times the Gibbs free energy reduction in forming the respective metal-disilicide at the same processing temperature.

In particular, the method includes the steps of forming a first capping layer containing the preselected metal on a silicon-on-insulator (SOI) substrate which has an insulating underlayer and a silicon outerlayer thereon. Thereafter, a first portion of the silicon outerlayer is converted to a first metal-disilicide layer containing the metal. The metal is provided by the first capping layer. The converting step is preferably provided by an annealing step. Next, a second metal-disilicide layer which also contains the metal is formed between the first metal-disilicide layer and the insulating underlayer. This latter step is preferably accomplished by forming a second capping layer on the first metal-disilicide layer and then converting a second portion of the silicon outerlayer, between the first metal-disilicide layer and the insulating underlayer, to a second metal-disilicide layer which is contiguous with the first metal-disilicide layer. This converting step is preferably an annealing step as well. The second capping layer also contains the metal as metal-monosilicide.

According to one aspect of the present invention, the second metal-disilicide layer may extend adjacent the insulating layer so that the entire silicon outerlayer is consumed. Moreover, the method can be performed selectively so that only preselected regions of the silicon outerlayer are converted to metal-disilicide, while remaining regions are left unaffected and can be used for forming a variety of electronic devices therein, such as IGFETs, MESFETs, etc.

The first capping layer forming step preferably includes the steps of depositing a first layer containing titanium on the silicon outerlayer and depositing a second layer containing the preselected metal such as cobalt on the first layer. More preferably, the first capping layer forming step includes the steps of forming a bimetallic capping layer having a titanium underlayer and a layer of the preselected metal on the titanium underlayer, as opposed to a bimetallic alloy containing both titanium and the preselected metal, which is less preferred. The second capping layer forming step also preferably includes the steps of depositing a third layer containing titanium on the first metal-disilicide layer, and then depositing a fourth layer containing metal-monosilicide on the third layer.

By providing metal-monosilicide in the second capping layer, phase reversal of the first metal-disilicide layer to metal-monosilicide can be prevented, even though the Gibbs free energy reduction in forming metal-monosilicide is greater than 0.5 times the Gibbs free energy reduction in forming metal-disilicide. For example, the Gibbs free energy reduction for $CoSi_2$ and CoSi at 727° C. is ~95.1 KJ/mole and ~88.9 KJ/mole, respectively. Accordingly, because the formation of CoSi releases more Gibbs free energy than the formation of $CoSi_2$, CoSi is typically the more favorable end product when a silicon-poor (i.e., SOI) environment is present. However, according to the present invention, the formation of CoSi from Co and Si is prevented and the phase-reversal of $CoSi_2$ to CoSi is prevented by making the formation of $CoSi_2$ the only energetically favorable reaction.

As will be understood by those skilled in the art, a method according to the present invention can be used to form metal-disilicide contacts for a variety of SOI electronic devices such as IGFETs, MESFETs, etc. In particular, an IGFET having cobalt-disilicide contacts may be formed by providing a SOI substrate having an insulating underlayer and a silicon outerlayer thereon, and forming a gate insulating layer and a conductive gate electrode having first and second ends on the SOI substrate. Source and drain regions are formed in the silicon outerlayer and insulating spacers are formed on the source and drain regions, at the first and second ends of the conductive gate electrode. A first bimetallic capping layer containing cobalt is formed on the source region and on the drain region, and the SOI substrate is annealed to convert a first portion of the source region and a first portion of the drain region to cobalt-disilicide.

A second bimetallic capping layer containing cobalt-silicide may be formed on the source region and on the drain region. The SOI substrate can then be annealed to convert a second portion of the source region, between the respective first portion and the insulating underlayer, to cobalt-disilicide and to convert a second portion of the drain region, between the respective first portion and the insulating underlayer, to cobalt-disilicide.

The first bimetallic capping layer forming step preferably includes the steps of depositing a first layer containing titanium on the source region and on the drain region and then depositing a second layer containing cobalt on the first layer. Moreover, the second bimetallic capping layer forming step preferably includes the steps of depositing a third layer containing titanium on the source region and on the drain region and then depositing a fourth layer containing cobalt-silicide on the third layer. The third layer depositing step is preferably preceded by the step of etching the substrate to expose the cobalt-disilicide portions of the source and drain regions so that the third layer physically contacts exposed portions of the source and drain regions.

DESCRIPTION OF A PREFERRED EMBODIMENT

The present invention will now be described more fully hereinafter with reference to the accompanying drawings, in which a preferred method of forming a metal-disilicide layer is shown. This invention may, however, be embodied in different forms and should not be construed as limited to the embodiment set forth herein. Rather, this embodiment is provided so that this disclosure will be thorough and complete, and will fully convey the scope of the invention to those skilled in the art. Like numbers refer to like elements throughout. For greater clarity, the thickness of the layers as shown has been exaggerated.

Figure 1A:
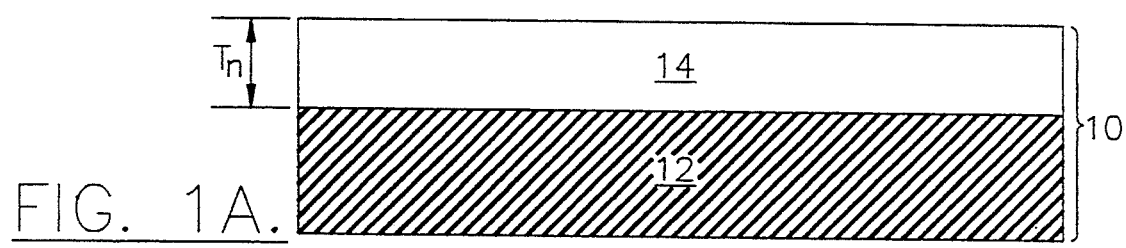
FIGS. 1A–1E are cross-sectional views illustrating intermediate structures for a method of forming a metal-disilicide ($MSi_2$) layer on an insulating substrate according to the present invention.

Referring now to FIGS. 1A–1E, a preferred embodiment of a method of selectively forming a metal-disilicide ($MSi_2$) layer on a silicon-on-insulator substrate (SOI) is illustrated. Referring to FIG. 1A, a SOI substrate 10 has an insulating underlayer 12 and a silicon outerlayer 14 thereon. The silicon outerlayer 14 has a predetermined nominal thickness "$T_n$", however the actual thickness of the silicon outerlayer may vary across the substrate 10. By way of example, the substrate 10 may include a 0.8 μm insulating underlayer 12 and a 1000 Å silicon outerlayer 14 thereon. As will be understood by those skilled in the art, the substrate may be formed from a (001) oriented n-type wafer (not shown), using conventional SIMOX processing techniques to implant a buried $SiO_2$ layer as the insulating underlayer 12. Other conventional SOI techniques may be used.

Figure 1B:
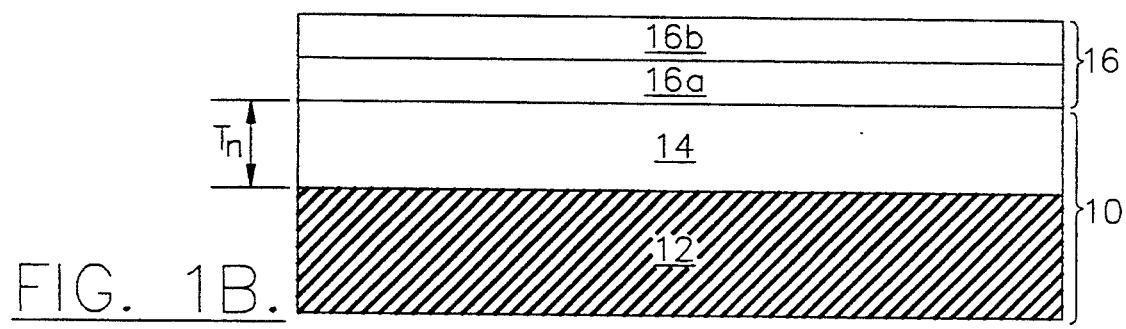

Referring now to FIG. 1B, a first capping layer 16 is formed on silicon outerlayer 14. First capping layer 16 preferably includes titanium and the preselected metal. As will be understood by those skilled in the art, the role of titanium is to allow epitaxial $CoSi_2$ to nucleate. The step of forming the first capping layer 16 preferably includes the steps of forming a first layer 16a containing titanium on the silicon outerlayer 14 and then forming a second layer 16b containing the preselected metal on the first layer 16a. The first capping layer 16 preferably includes a bimetallic capping layer as opposed to a less preferred bimetallic alloy which contains both titanium and the preselected metal. By way of example, the bimetallic capping layer may include electron-beam deposited Ti/Co layers having respective thicknesses of 60/1000 Å.

Figure 1C:
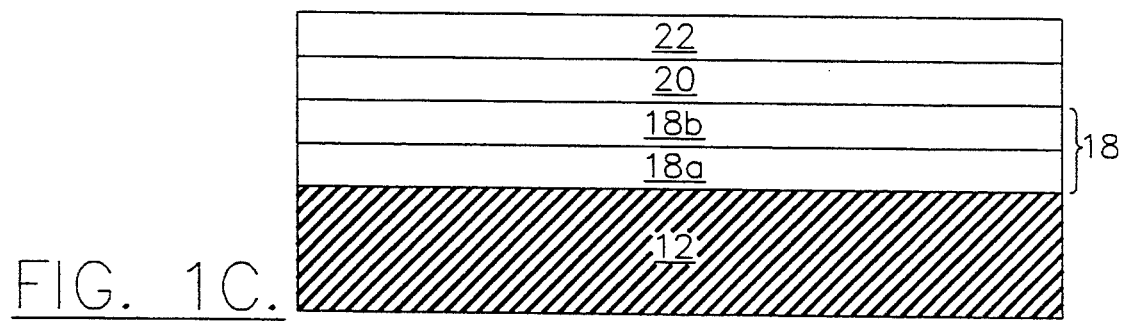

Referring now to FIG. 1C, a step is then performed to convert a first portion of the silicon outerlayer to metal-disilicide. Preferably, this step is performed as a first annealing step to convert a first portion of the silicon outerlayer 14 to a first monocrystalline/epitaxial metal-disilicide layer 18b. The metal-disilicide layer 18b extends adjacent a remaining portion of the silicon outerlayer, shown as 18a. As will be understood by those skilled in the art, the performance of an annealing step may also cause the formation of a metal-monosilicide (MSi) layer 20 on the first metal-disilicide layer 18b and also cause the formation of a layer 22 which contains titanium, silicon and the preselected metal.

The first annealing step may include the step of performing a rapid thermal anneal at 600° C. for 10 seconds in a dry $N_2$ ambient, so that the entire silicon outerlayer 14 having an exemplary nominal thickness $T_n$ of 1000 Å is only partially consumed. If the above-described bimetallic Ti/Co capping layer 16 is used, layers 18b–22 will respectively include monocrystalline/epitaxial cobalt-disilicide ($CoSi_2$), cobalt-silicide (CoSi) and an alloy of cobalt, titanium and silicon. An etching step may also be performed to expose the first metal-disilicide layer 18b before subsequent processing of the remaining portion of the silicon outerlayer 18a occurs. Etching of CoSi can be achieved by using an aqueous solution containing $HCl:H_2O_2 = 1:3$, which does not etch $CoSi_2$ and $SiO_2$.

The first annealing step is preferably followed by the step of simultaneously (i) preventing phase-reversal of the first metal-disilicide layer 18b to metal-monosilicide and (ii) forming a second metal-disilicide layer between the first metal-disilicide layer 18b and the insulating underlayer 12. Although not wishing to be bound by any theory, it is believed that the phase-reversal of metal-disilicide ($MSi_2$) to metal-monosilicide (MSi) will typically occur when: (i) the Gibbs free energy reduction in forming metal-monosilicide (e.g., CoSi) is greater than 0.5 times the Gibbs free energy reduction in forming metal-disilicide (e.g., $CoSi_2$) at the annealing temperature and (ii) the reaction of the constituent metal (e.g., Co) with silicon occurs in a "silicon-poor" (or "metal-rich") environment. The silicon-poor environment is caused by the presence of the insulating underlayer 12 which limits the quantity of silicon available for conversion to $MSi_2$ and therefore encourages the formation of MSi when the respective Gibbs free energy reductions are related as previously described.

Figure 1D:
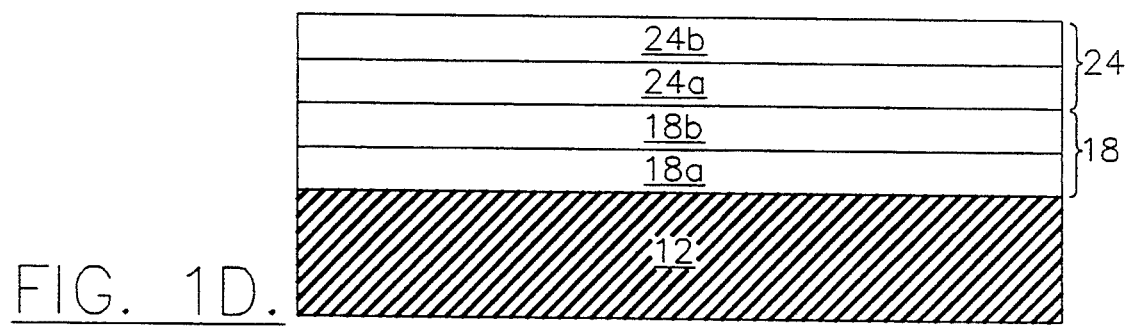

Referring now to FIG. 1D, phase-reversal can be prevented by forming a second capping layer 24 containing metal-monosilicide on the first metal-disilicide layer 18b. The step of forming the second capping layer 24 preferably includes the steps of depositing a third layer 24a containing titanium on the first metal-disilicide layer 18b and then depositing a fourth layer 24b containing metal-monosilicide on the third layer 24a. The second capping layer 24 preferably includes a bimetallic capping layer and may by way of example include electron-beam deposited Ti/CoSi layers having respective thicknesses of 60/2250 Å.

Figure 1E:
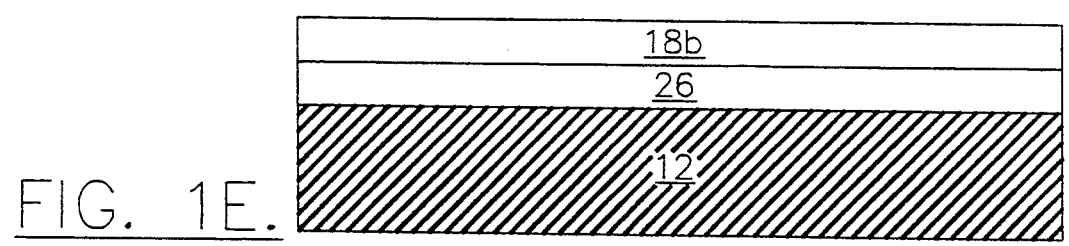

Another step is then performed to convert a portion of the silicon outerlayer 18a (i.e., a second portion of the silicon outerlayer 14) to a second metal-disilicide layer 26. The second metal-disilicide layer 26 is contiguous with the first metal-disilicide layer 18b and preferably contacts or extends adjacent the insulating underlayer 12. Preferably, this converting step is performed as a second annealing step. The duration of the second annealing step can be selected so that the second metal-disilicide layer 26 extends adjacent the insulating underlayer 12 and a relatively thin layer of unreacted silicon (not shown) extends between the second metal-disilicide layer 26 and the insulating underlayer 12. Finally, an etching step is performed to expose the first metal-disilicide layer 18b and prepare the substrate for further processing, as illustrated by FIG. 1E.

Because of the excellent structural, thermal and resistance characteristics of epitaxial films such as $CoSi_2$, which are achieved by the present method, these films are particularly useful as contacts in SOI electronic devices. For example, referring now to FIGS. 2A–2I, a preferred embodiment of a method of forming an electronic device having low resistance cobalt-disilicide contacts is illustrated. In particular, FIGS. 2A–2I illustrate a method of forming a SOI insulated-gate field effect transistor having cobalt-disilicide source and drain contacts, which incorporates the steps illustrated by FIGS. 1A–1E. As will be understood by those skilled in the art, the steps of FIGS. 1A–1E may be incorporated into methods of forming a variety of SOI electronic devices, where metal-disilicide contacts are desired for ohmically contacting the active regions of the device. Typical active regions can include the base, emitter and collector regions of a bipolar junction transistor and the source and drain regions of a field effect transistor.

Figure 2A:
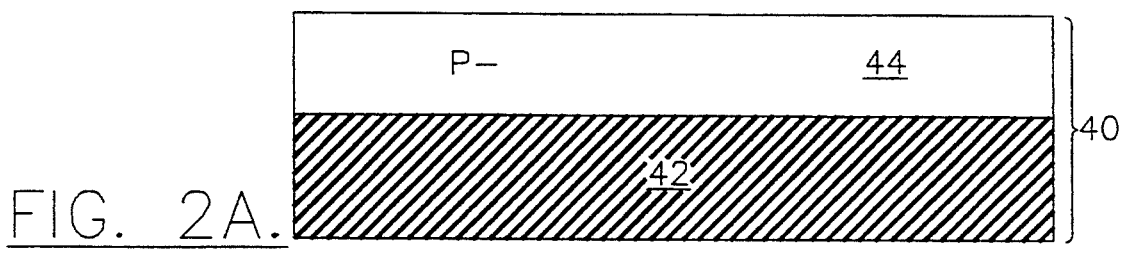
FIGS. 2A–2I are cross-sectional views illustrating intermediate structures for a method of forming an insulated-gate field effect transistor having cobalt-disilicide ($CoSi_2$) source and drain contacts according to the present invention.
Figure 2B:
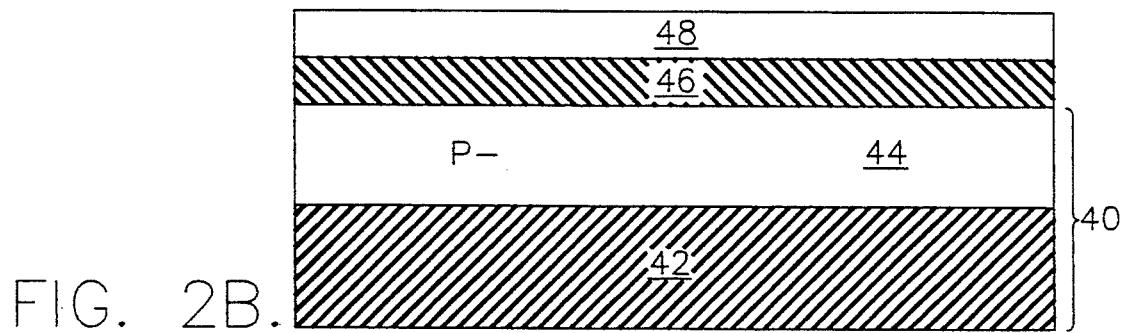
Figure 2C:
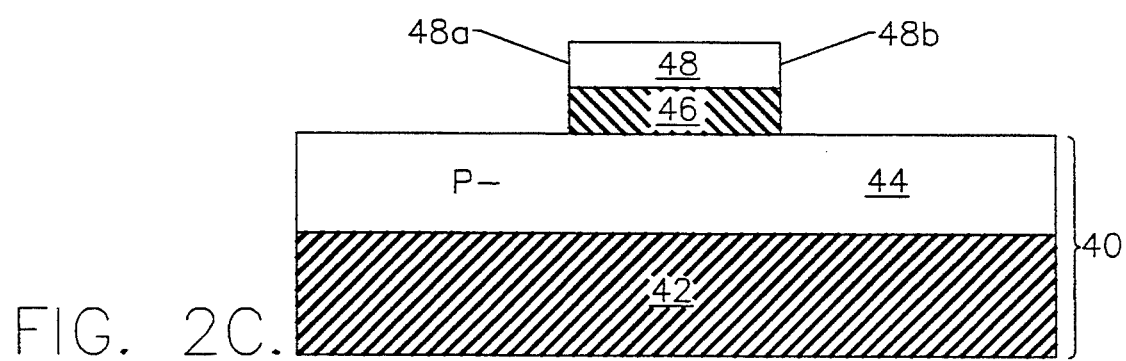

Referring now to FIGS. 2A–2B, the step of forming a gate insulating layer 46 such as $SiO_2$ on a SOI substrate 40 having an insulating underlayer 42 and a silicon outerlayer 44 thereon (shown as P-type), is illustrated. This step can occur using any one of a number of conventional techniques such as thermal oxidation, deposition, etc. Thereafter, a conductive gate electrode layer 48, such as doped or undoped polycrystalline silicon, is formed on the gate insulating layer 46. As illustrated by FIG. 2C, layers 48 and 46 can be patterned to define first and second ends 48a–b thereof.

Figure 2D:
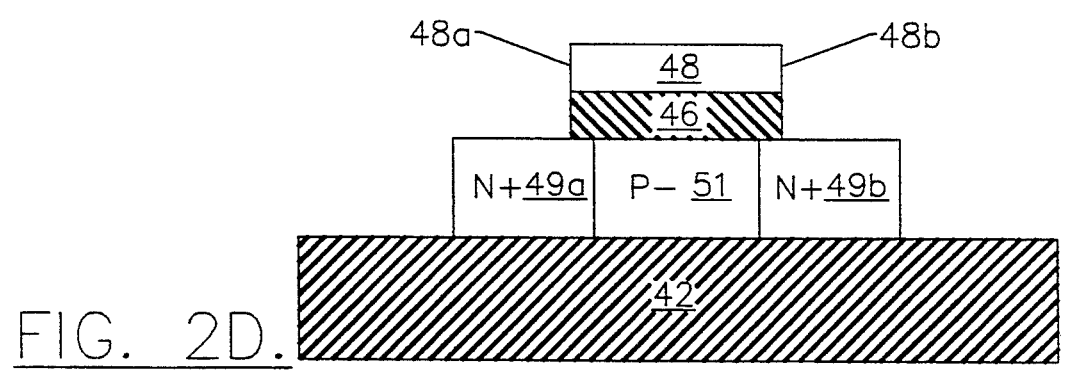

Source and drain regions 49a, 49b, respectively, (shown as N-type) can also be formed in the silicon outerlayer 44 using conventional implantation and/or diffusion techniques, etc. Remaining adjacent regions of the silicon outerlayer 44 can also be removed by an etching step. As illustrated by FIG. 2D, the source and drain regions preferably define an active or channel region 51 in the silicon outerlayer 44.

Figure 2E:
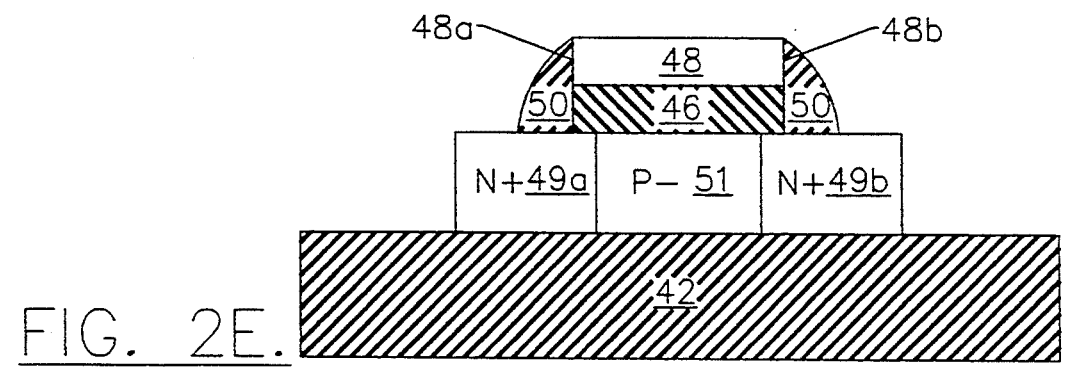
Figure 2F:
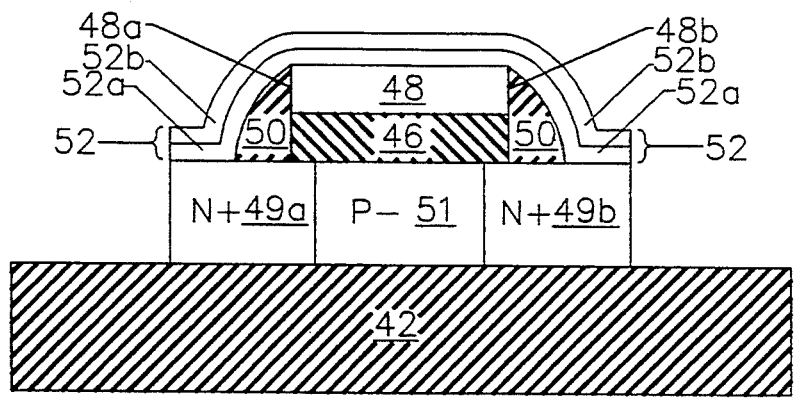

Insulating spacers 50, such as $SiO_2$, can also be formed on the source and drain regions 49a–b, at the first and second ends 48a–b of the conductive gate electrode 48, as shown in FIG. 2E. Thereafter, a first bimetallic capping layer 52 containing cobalt can be formed on the source region and on the drain region, as illustrated by FIGS. 2F. This latter step preferably includes the steps of depositing a first layer 52a containing titanium and then depositing a second layer 52b containing cobalt on the first layer.

Figure 2G:
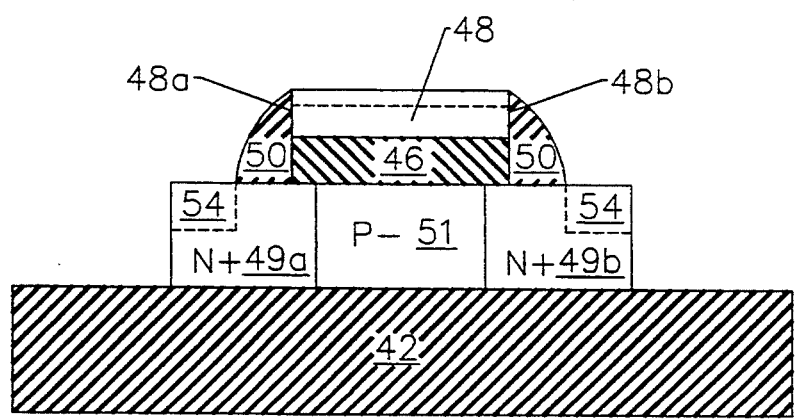

Referring now to FIG. 2G, an annealing step can be performed to convert a first portion of the source and drain regions (shown as 54) to cobalt-disilicide. The duration of the annealing step should be kept relatively short so that the first portions 54 do not extend to the insulating underlayer 42, as illustrated. If the gate electrode 48 is silicon, a portion of the gate electrode (shown by dotted lines) may be converted to cobalt-disilicide.

Figure 2H:
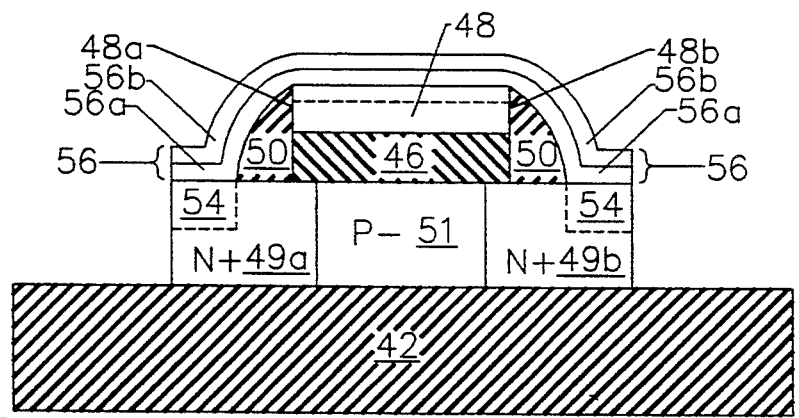

Following this annealing step, a second bimetallic capping layer 56 is formed on the source region 49a and on the drain region 49b. This capping layer forming step preferably includes the steps of depositing a third layer 56a containing titanium on the source region and on the drain region and depositing a fourth layer 56b containing cobalt-silicide on the third layer, as illustrated by FIG. 2H. Preferably, the third layer depositing step is preceded by an etching step to expose the first portions 54, as shown in FIG. 2G.

Figure 2I:
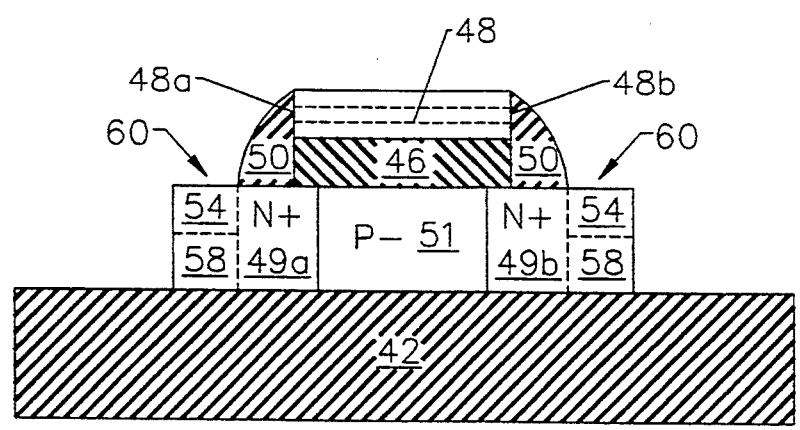

Referring now to FIG. 2I, an annealing step is next performed to convert a second portion 58 of the source and drain regions 49a–b to cobalt-disilicide, thereby forming cobalt-disilicide source and drain contacts 60. The source and drain regions may be fully- or partially-silicided. For example, the second portions 58 may contact the insulating underlayer 42 (as shown) or thin silicon regions (not shown) may remain between the second portions 58 and the insulating underlayer 42. As described above, a second portion of the gate electrode 48, beneath the first portion, may also be converted to cobalt-disilicide.

In accordance with the present invention, phase-reversal of the first cobalt-disilicide portions 54 ($CoSi_2$) to cobalt-silicide (CoSi) can be prevented by providing a second capping layer 56 containing silicon. This insures that further conversion of the source and drain regions 49a–b to cobalt-disilicide does not occur in a silicon-poor environment which, as explained above, promotes the phase-reversal of cobalt-disilicide to cobalt-silicide, based on the relative values of the Gibbs free energy reduction.

As will be understood by those skilled in the art, the above-described embodiment illustrated in FIGS. 1A–1E, can be extended to other SOI devices as well. For example, integrated SOI bipolar and CMOS transistors could be manufactured to include cobalt-disilicide contacts during back-end BiCMOS processing.

The drawings and specification disclose typical preferred embodiments of the present invention and, although specific terms are employed, they are used in a generic and descriptive sense only and not for purposes of limitation, the scope of the invention being set forth in the following claims.

That which is claimed:

1. A method of forming a cobalt-disilicide layer, comprising the steps of:
   providing a silicon-on-insulator substrate having an insulating underlayer and a silicon outerlayer thereon;
   forming a first capping layer containing cobalt on said silicon outerlayer;
   annealing said substrate to convert a first portion of said silicon outerlayer to a first cobalt-disilicide layer;
   forming a second capping layer containing cobalt-silicide on said first cobalt-disilicide layer; and
   annealing said substrate to convert a second portion of said silicon outerlayer, between said first portion and said insulating underlayer, to a second cobalt-disilicide layer.

2. The method of forming a cobalt-disilicide layer according to claim 1, wherein said first capping layer forming step comprises the steps of:
   depositing a first layer containing titanium on said silicon outerlayer; and
   depositing a second layer containing cobalt on said first layer.

3. The method of forming a cobalt-disilicide layer according to claim 2, wherein said second capping layer forming step comprises the steps of:
   depositing a third layer containing titanium on said first cobalt-disilicide layer; and
   depositing a fourth layer containing cobalt-silicide on said third layer.

4. The method of forming a cobalt-disilicide layer according to claim 3, wherein said third layer depositing step is preceded by the step of etching said substrate to expose said first cobalt-disilicide layer.

5. The method of forming a cobalt-disilicide layer according to claim 4, wherein said annealing step to convert a second portion of said silicon outerlayer comprises the step of annealing said substrate to convert the second portion to monocrystalline cobalt-disilicide.

6. A method of selectively forming a metal-disilicide layer containing silicon and a metal, comprising the steps of:
   forming a first capping layer containing the metal on a silicon substrate;
   annealing said substrate at a first temperature to convert a first portion thereof to a first metal-disilicide layer containing the metal; and
   forming a second metal-disilicide layer containing the metal adjacent said first metal-disilicide layer,
   wherein the metal is selected so that at the first temperature, a Gibbs free energy reduction in forming metal-monosilicide from silicon and the metal is greater than 0.5 times a Gibbs free energy reduction in forming metal-disilicide from silicon and the metal.

7. The method of selectively forming a metal-disilicide layer according to claim 6, wherein said second metal-disilicide layer forming step comprises the steps of:
   forming a second capping layer containing metal-monosilicide having the preselected metal therein, on said first metal-disilicide layer; and
   annealing said substrate to convert a second portion thereof to a second metal-disilicide layer which is contiguous with said first metal-disilicide layer.

8. The method of selectively forming a metal-disilicide layer according to claim 6, wherein said first capping layer forming step comprises the steps of:
   forming a first layer containing titanium on said silicon substrate; and
   forming a second layer containing the metal on said first layer.

9. The method of selectively forming a metal-disilicide layer according to claim 7, wherein said first capping layer forming step comprises the steps of:
   forming a first layer containing titanium on said silicon substrate; and
   forming a second layer containing the metal on said first layer.

10. The method of selectively forming a metal-disilicide layer according to claim 9, wherein said second capping layer forming step comprises the steps of:
    forming a third layer containing titanium on said first metal-disilicide layer; and
    forming a fourth layer containing metal-monosilicide having the preselected metal therein, on said third layer.

11. The method of selectively forming a metal-disilicide layer according to claim 10, wherein said third layer forming step is preceded by the step of etching said substrate to expose said first metal-disilicide layer.

12. The method of selectively forming a metal-disilicide layer according to claim 7, wherein said annealing step to convert the second portion of said silicon substrate comprises the step of annealing said substrate to convert the second portion to monocrystalline metal-disilicide.

13. A method of forming a silicon-on-insulator insulated-gate field effect transistor having cobalt-disilicide source and drain contacts, comprising the steps of:
    providing a silicon-on-insulator substrate having an insulating underlayer and a silicon outerlayer thereon;
    forming a gate insulating layer on said silicon outerlayer;
    forming a conductive gate electrode having first and second ends on said gate insulating layer;
    forming a source region and a drain region in said silicon outerlayer adjacent the first end and the second end, respectively, of said conductive gate electrode, to thereby define a silicon channel region between said source region and said drain region and between said insulating underlayer and said gate insulating layer;

forming insulating spacers on said source and drain regions at the first and second ends of said conductive gate electrode, respectively;

forming a first bimetallic capping layer containing cobalt on said source region and on said drain region; and annealing said substrate to convert a first portion of said source region to cobalt-disilicide and covert a first portion of said drain region to cobalt-disilicide.

14. The method of forming an insulated-gate transistor according to claim 13, wherein said annealing step is followed by the steps of:

forming a second bimetallic capping layer containing cobalt-silicide on said source region and on said drain region; and annealing said substrate to convert a second portion of said source region, between said first portion of said source region and said insulating underlayer, to cobalt-disilicide and to convert a second portion of said drain region, between said first portion of said drain region and said insulating underlayer, to cobalt-disilicide.

15. The method of forming an insulated-gate transistor according to claim 14, wherein said first bimetallic capping layer forming step comprises the steps of:

depositing a first layer containing titanium on said source region and on said drain region; and depositing a second layer containing cobalt on said first layer.

16. The method of forming an insulated-gate transistor according to claim 15, wherein said second capping layer forming step comprises the steps of:

depositing a third layer containing titanium on said source region and on said drain region; and depositing a fourth layer containing cobalt-silicide on said third layer.

17. The method of forming an insulated-gate transistor according to claim 16, wherein said third layer depositing step is preceded by the step of etching said substrate to expose said first portion of said source region and expose said first portion of said drain region.

18. The method of forming an insulated-gate transistor according to claim 17, wherein said annealing step to convert a second portion of said source region and convert a second portion of said drain region comprises the step of annealing said substrate to convert the second portion of said source region and convert the second portion of said drain region to monocrystalline cobalt-disilicide.

19. A method of forming a SOI electronic device having cobalt-disilicide contacts, comprising the steps of:

providing a silicon-on-insulator substrate having an insulating underlayer and a silicon outerlayer thereon;

forming an electronic device having a plurality of active regions in said silicon outerlayer; and forming a cobalt-disilicide contact to at least one of said active regions by:

forming a first bimetallic capping layer containing cobalt on said active region;

annealing said substrate to convert a first portion of said active region to cobalt-disilicide;

forming a second bimetallic capping layer containing cobalt-silicide on said first portion; and annealing said substrate to convert a second portion of said active region, between said first portion and said insulating underlayer, to cobalt-disilicide.

20. The method of forming a SOI electronic device according to claim 19, wherein said first bimetallic capping layer forming step comprises the steps of:

depositing a first layer containing titanium on said active region; and depositing a second layer containing cobalt on said first layer.

21. The method of forming a SOI electronic device according to claim 20, wherein said second capping layer forming step comprises the steps of:

depositing a third layer containing titanium on said first portion; and depositing a fourth layer containing cobalt-silicide on said third layer.

22. The method of forming an insulated-gate transistor according to claim 13, wherein said annealing step is performed to convert a first portion of said source region, opposite said channel region, to cobalt-disilicide and convert a first portion of said drain region, opposite said channel region, to cobalt-disilicide, without converting a portion of said source region adjacent said channel region to cobalt-disilicide and without converting a portion of said drain region adjacent said channel region to cobalt-disilicide.

23. The method of forming an insulated-gate transistor according to claim 14, wherein said step of annealing said substrate to convert a second portion of said source region and said drain region to cobalt-disilicide is performed without converting a portion of said source region adjacent said channel region to cobalt-disilicide and without converting a portion of said drain region adjacent said channel region to cobalt-disilicide.

24. The method of forming an insulated-gate transistor according to claim 14, wherein said source and drain regions are of first conductivity type and said channel region is of second conductivity type, opposite said first conductivity type; wherein the step of annealing said substrate to convert a second portion of said source region to cobalt-disilicide is performed so that a silicon region of first conductivity type is provided between said first and second portions of said source region and said channel region; and wherein said step of annealing said substrate to convert a second portion of said drain region to cobalt-disilicide is performed so that a silicon region of first conductivity type is provided between said first and second portions of said drain region and said channel region.

* * * * *